(12) United States Patent
Lee et al.

(10) Patent No.: US 12,101,961 B2
(45) Date of Patent: Sep. 24, 2024

(54) DISPLAY DEVICE HAVING THIN-FILM ENCAPSULATION LAYER LOCATED AT A FIRST DAM AND MANUFACTURING METHOD THEREFOR

(71) Applicant: Samsung Display Co., Ltd., Yongin-si (KR)

(72) Inventors: Minsu Lee, Yongin-si (KR); Keunsoo Lee, Hwaseong-si (KR); Changhyun Ko, Cheonan-si (KR); Yongjin Kim, Cheonan-si (KR); Jaehak Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 705 days.

(21) Appl. No.: 17/284,749

(22) PCT Filed: Feb. 1, 2019

(86) PCT No.: PCT/KR2019/001451
§ 371 (c)(1),
(2) Date: Apr. 12, 2021

(87) PCT Pub. No.: WO2020/080613
PCT Pub. Date: Apr. 23, 2020

(65) Prior Publication Data
US 2021/0351378 A1    Nov. 11, 2021

(30) Foreign Application Priority Data

Oct. 17, 2018   (KR) .................. 10-2018-0123620

(51) Int. Cl.
*H10K 50/844*   (2023.01)
*H10K 50/842*   (2023.01)
(Continued)

(52) U.S. Cl.
CPC ..... *H10K 50/8445* (2023.02); *H10K 50/8428* (2023.02); *H10K 59/122* (2023.02); *H10K 71/00* (2023.02)

(58) Field of Classification Search
CPC .. H10K 50/8445; H10K 59/122; H10K 71/00; H10K 50/8428
See application file for complete search history.

(56) References Cited

U.S. PATENT DOCUMENTS

| 2014/0183472 A1 | 7/2014 | Kim et al. |
| 2016/0190503 A1 | 6/2016 | Chang et al. |

(Continued)

FOREIGN PATENT DOCUMENTS

| CN | 104885250 A | 9/2015 |
| KR | 10-2016-0081106 A | 7/2016 |

(Continued)

*Primary Examiner* — Michael Jung
(74) *Attorney, Agent, or Firm* — Lewis Roca Rothgerber Christie LLP

(57) ABSTRACT

A display device may include a substrate including a display area and a transmission area located on an outer side of the display area, a display unit in the display area on the substrate, a thin-film encapsulation layer that covers the display unit, and a first dam between the thin-film encapsulation layer and the transmission area on the substrate, and an end portion of the thin-film encapsulation layer may be located on an inner side of the first dam.

19 Claims, 13 Drawing Sheets

(51) Int. Cl.
*H10K 59/122* (2023.01)
*H10K 71/00* (2023.01)

(56) References Cited

U.S. PATENT DOCUMENTS

| | | | |
|---|---|---|---|
| 2017/0069871 A1* | 3/2017 | Yim | .................... H10K 50/844 |
| 2017/0237038 A1 | 8/2017 | Kim et al. | |
| 2017/0279057 A1 | 9/2017 | Park et al. | |
| 2017/0365814 A1 | 12/2017 | Kim et al. | |
| 2018/0061722 A1* | 3/2018 | Byun | ...................... H01L 22/14 |
| 2018/0124933 A1 | 5/2018 | Park et al. | |
| 2018/0159077 A1 | 6/2018 | Lee et al. | |
| 2018/0166525 A1 | 6/2018 | Kim et al. | |
| 2020/0006702 A1* | 1/2020 | Sonoda | .................. H10K 59/88 |
| 2022/0173356 A1 | 6/2022 | Kim et al. | |

FOREIGN PATENT DOCUMENTS

| | | |
|---|---|---|
| KR | 10-2017-0040860 A | 4/2017 |
| KR | 10-2017-0096646 A | 8/2017 |
| KR | 10-2017-0110214 A | 10/2017 |
| KR | 10-2017-0142232 A | 12/2017 |
| KR | 10-1813459 B1 | 1/2018 |
| KR | 10-2018-0048247 A | 5/2018 |
| KR | 10-2018-0064601 A | 6/2018 |

\* cited by examiner

DISPLAY DEVICE HAVING THIN-FILM ENCAPSULATION LAYER LOCATED AT A FIRST DAM AND MANUFACTURING METHOD THEREFOR

CROSS-REFERENCE TO RELATED APPLICATIONS

This application is a U.S. National Phase Patent Application of International Application Number PCT/KR2019/001451, filed on Feb. 1, 2019, which claims priority to and the benefit of Korean Patent Application Number 10-2018-0123620, filed on Oct. 17, 2018, the entire content of each of which is incorporated herein by reference.

BACKGROUND

Technical Field

Aspects of some embodiments to a display device. More particularly, aspects of some embodiments relate to a display device including a transmission area and a method of manufacturing the display device.

Background Art

With the rapid development of a display field for visually expressing various electrical signal information, various flat panel display devices having excellent characteristics such as lower thickness, lighter weight, or lower power consumption have been used. In addition, in order to increase user conveniences such as portability and slimness, flexible display devices have been researched and developed.

The flexible display device may include a thin-film encapsulation layer in which an inorganic encapsulation layer and an organic encapsulation layer are alternately stacked to block moisture, oxygen, and the like from penetrating from an outside. The organic encapsulation layer may be an organic material having fluidity before curing, and when the organic material is excessively applied, the organic material may deviate from a display area to flow over a peripheral area. Accordingly, a dam may be formed at a periphery of the display area to prevent leakage of the organic material.

A transmission area may be formed in the peripheral area of the display device, and a camera or the like may be located under the display device to correspond to the transmission area, so that external light may be introduced into the camera or the like through the transmission area. Meanwhile, when the inorganic encapsulation layer of the thin-film encapsulation layer is formed in the transmission area, a light transmittance of the transmission area may be reduced.

The above information disclosed in this Background section is only for enhancement of understanding of the background and therefore the information discussed in this Background section does not necessarily constitute prior art.

DISCLOSURE

Technical Problem

An object of the present invention is to provide a display device in which a transmission area is not covered by a thin-film encapsulation layer.

An object of the present invention is to provide a method of manufacturing a display device for preventing a thin-film encapsulation layer from being formed on a transmission area.

Technical Solution

According to some embodiments of the present invention described above, a display device may include a substrate including a display area and a transmission area located on an outer side of the display area, a display unit located in the display area on the substrate, a thin-film encapsulation layer that covers the display unit, and a first dam located between the thin-film encapsulation layer and the transmission area on the substrate. An end portion of the thin-film encapsulation layer may be located on an inner side of the first dam.

In some embodiments, the display device may further include a second dam surrounding the display area and located between the display unit and the first dam on the substrate.

In some embodiments, the thin-film encapsulation layer may include a first inorganic encapsulation layer, an organic encapsulation layer, and a second inorganic encapsulation layer that are sequentially stacked.

In some embodiments, the organic encapsulation layer may be located on an inner side of the second dam, and an end portion of the first inorganic encapsulation layer and an end portion of the second encapsulation layer may make contact with each other on an outer side of the second dam.

In some embodiments, the first inorganic encapsulation layer may include silicon oxynitride, and the second inorganic encapsulation layer may include silicon nitride.

In some embodiments, the display device may further include a third dam surrounding the second dam and located on the substrate to face the first dam with the transmission area interposed therebetween.

In some embodiments, the first dam may be directly located on the substrate.

In some embodiments, the first dam may extend in a first direction, and a width of the transmission area in the first direction may be smaller than a width of the display area in the first direction.

In some embodiments, a length of the first dam in the first direction may be equal to the width of the display area.

In some embodiments, a length of the first dam in the first direction may be equal to the width of the transmission area.

In some embodiments, a length of the first dam in the first direction may be less than the width of the display area and greater than the width of the transmission area.

In some embodiments, the display unit may include a thin film transistor located on the substrate, a first insulating layer that covers the thin film transistor, a second insulating layer located on the first insulating layer, a first electrode located on the second insulating layer, a pixel defining layer located on the second insulating layer and including an opening that exposes a part of the first electrode, a light emitting layer located on the first electrode exposed by the opening, and a second electrode located on the light emitting layer.

In some embodiments, the first dam may include a same material as one of the first insulating layer, the second insulating layer, and the pixel defining layer.

In some embodiments, the first dam may include a first layer and a second layer, the first layer may include a same material as one of the first insulating layer, the second insulating layer, and the pixel defining layer, and the second layer may include a same material as another one of the first insulating layer, the second insulating layer, and the pixel defining layer.

In some embodiments, the first dam may include a first layer, a second layer, and a third layer, the first layer may include a same material as one of the first insulating layer, the second insulating layer, and the pixel defining layer, the second layer may include a same material as another one of the first insulating layer, the second insulating layer, and the pixel defining layer, and the third layer may include a same material as remaining one of the first insulating layer, the second insulating layer, and the pixel defining layer.

In some embodiments, the display device may further include at least one inorganic insulating layer located between the substrate and the first insulating layer, and the transmission area may not be covered by the at least one inorganic insulating layer.

In some embodiments, the substrate may include silicon oxide.

According to some embodiments of the present invention, a method of manufacturing a display device may include preparing a substrate including a display area and a transmission area located on an outer side of the display area, forming a display unit in the display area on the substrate, forming a first dam between the display area and the transmission area on the substrate, arranging a mask, which has an opening corresponding to the display area, on the substrate to make contact with the first dam, and forming a thin-film encapsulation layer, which covers the display unit and has an end portion located on an inner side of the first dam, through the opening of the mask.

In some embodiments, the method may further include forming a second dam between the display unit and the first dam on the substrate before arranging the mask.

In some embodiments, the forming of the thin-film encapsulation layer may include forming a first inorganic encapsulation layer, which covers the display unit and the second dam and has an end portion located between the first dam and the second dam, by using the mask, forming an organic encapsulation layer located on an inner side of the second dam on the first inorganic encapsulation layer, and forming a second inorganic encapsulation layer, which covers the display unit and the second dam and has an end portion located between the first dam and the second dam, by using the mask.

Advantageous Effects

In the display device according to the embodiments, the first dam may be located between the display unit and the transmission area, and the end portion of the thin-film encapsulation layer covering the display unit may be located on the inner side of the first dam, so that the thin-film encapsulation layer may not cover the transmission area. Accordingly, the display device may include the transmission area having a relatively high light transmittance.

In the method of manufacturing the display device according to the embodiments, the mask may be located on the first dam formed between the display unit and the transmission area, and there may be no space between the mask and the first dam, so that the thin-film encapsulation layer may be formed on the inner side of the first dam, and the transmission area may not covered by the thin-film encapsulation layer. Accordingly, it is possible to prevent a decrease in the light transmittance of the transmission area of the display device.

MODE FOR INVENTION

Best Mode

Hereinafter, display devices and methods of manufacturing display devices in accordance with embodiments of the present invention will be explained in detail with reference to the accompanying drawings.

Hereinafter, a display device according to one embodiment of the present invention will be schematically described with reference to FIGS. 1 and 2.

Figure 1:
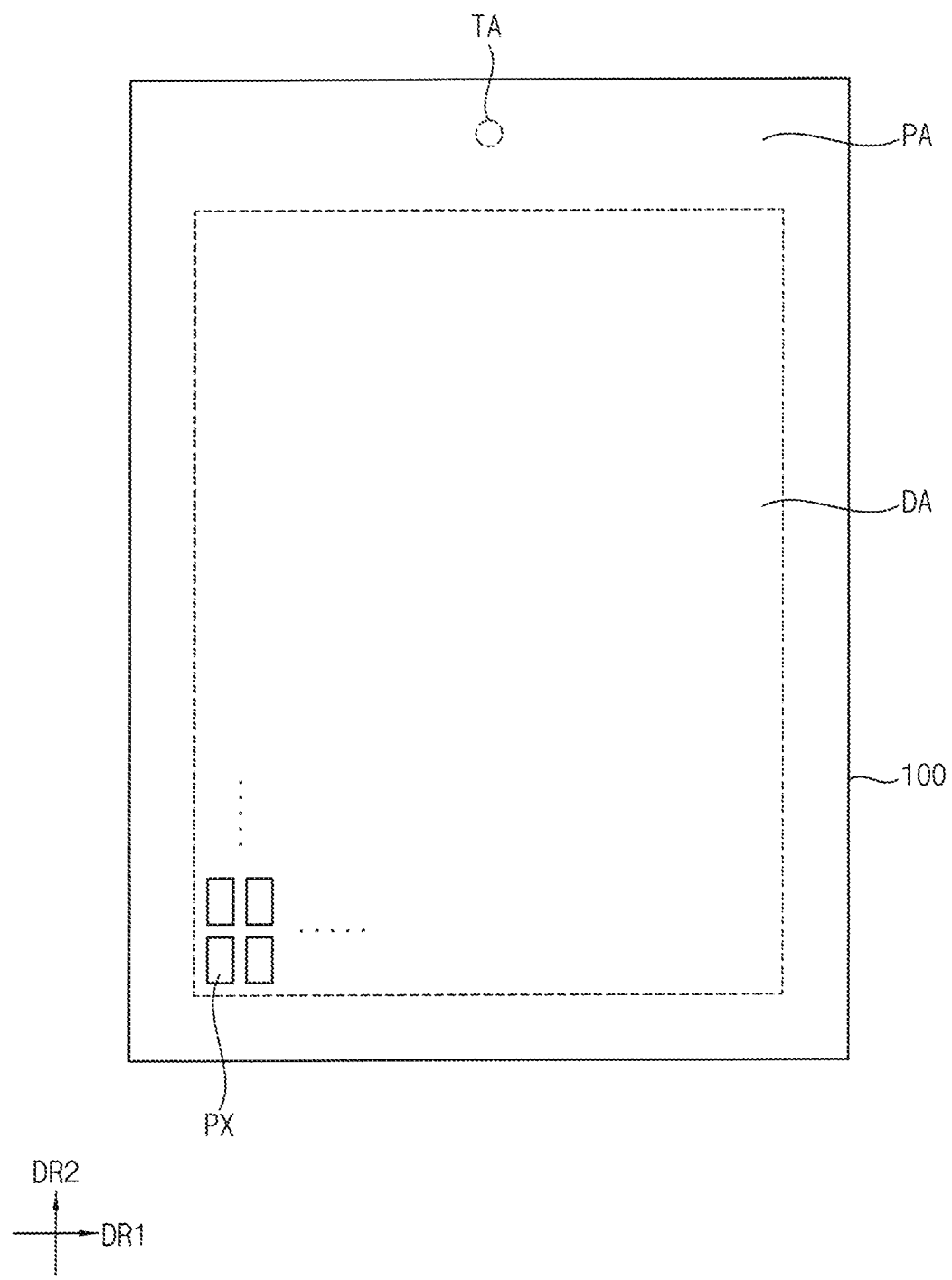
FIG. 1 is a plan view showing a display device according to one embodiment of the present invention.

FIG. 1 is a plan view showing a display device according to some embodiments of the present invention. FIG. 2 is a sectional view schematically showing the display device of FIG. 1.

Figure 2:
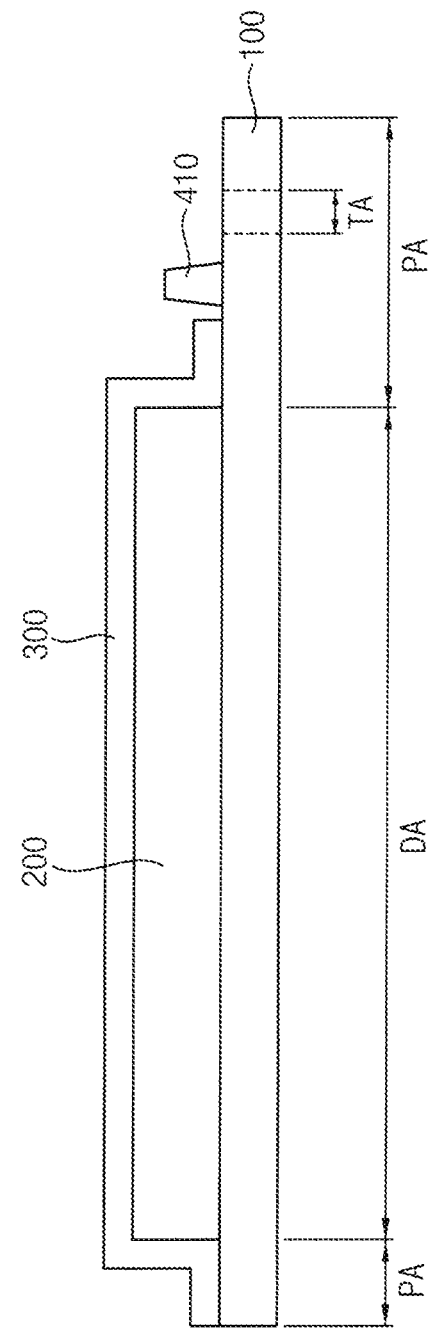
FIG. 2 is a sectional view schematically showing the display device of FIG. 1.

Referring to FIGS. 1 and 2, according to some embodiments of the present invention, a display device may include a substrate 100, a display unit 200, a thin-film encapsulation layer 300, and a first dam 410.

The substrate 100 may include a display area DA and a peripheral area PA. A plurality of pixels PX may be arranged in a first direction DR1 and a second direction DR2 intersecting the first direction DR1 in the display area DA, and an image may be displayed in the display area DA by combining lights emitted from the pixels PX, respectively. The display area DA may have a rectangular shape when viewed in a plan view, but embodiments according to the present invention are not limited thereto. The peripheral area PA may be located on an outer side of the display area DA. The peripheral area PA may be located on at least one side of the display area DA. In some embodiments, the peripheral area PA may surround the display area DA. For example, the peripheral area PA may surround four sides of the display area DA having a rectangular shape when viewed in a plan view. The pixels PX may not be located in the peripheral area PA, so that the peripheral area PA may be a non-display area.

The peripheral area PA may include a transmission area TA. The transmission area TA may be located on an outer side of the display area DA while being spaced apart from the display area DA. For example, the transmission area TA may be located in the second direction DR2 from the display area DA. In some embodiments, the transmission area TA may have a circular shape when viewed in a plan view. However, embodiments according to the present invention are not limited thereto, and the transmission area TA may have a polygonal shape or the like when viewed in a plan view. In some embodiments, a width of the transmission area TA in the first direction DR1 may be smaller than a width of the display area DA in the first direction DR1. The transmission area TA may allow external light to pass therethrough. In some embodiments, the transmission area TA may have a light transmittance of about 95% or more as compared with a vacuum. Accordingly, when a camera or the like is located under the transmission area TA of the substrate 100, the external light may reach the camera or the like through the transmission area TA of the substrate 100.

The display unit 200 may be located in the display area DA on the substrate 100. The display unit 200 may include pixels PX, so that the image may be displayed by the display unit 200.

The thin-film encapsulation layer 300 may cover the display unit 200. The thin-film encapsulation layer 300 may be located on the substrate 100 on which the display unit 200 is formed to cover the display unit 200. Accordingly, the thin-film encapsulation layer 300 may be located in the display area DA and a part of the peripheral area PA on the substrate 100. The thin-film encapsulation layer 300 may cover the display unit 200 to protect the display unit 200 from outside air.

The first dam 410 may be located in the peripheral area PA on the substrate 100. In detail, the first dam 410 may be located between the thin-film encapsulation layer 300 and the transmission area TA in the peripheral area PA. In other words, the thin-film encapsulation layer 300 and the transmission area TA may be spaced apart from each other with the first dam 410 interposed therebetween. In this case, the first dam 410 may be located on an outer side of the thin-film encapsulation layer 300, and the transmission area TA may be located on an outer side of the first dam 410. The first dam 410 may prevent the thin-film encapsulation layer 300 from being formed in the transmission area TA on the substrate 100.

Hereinafter, display devices according to some embodiments of the present invention will be described in detail with reference to FIGS. 3 to 8.

Figure 3:
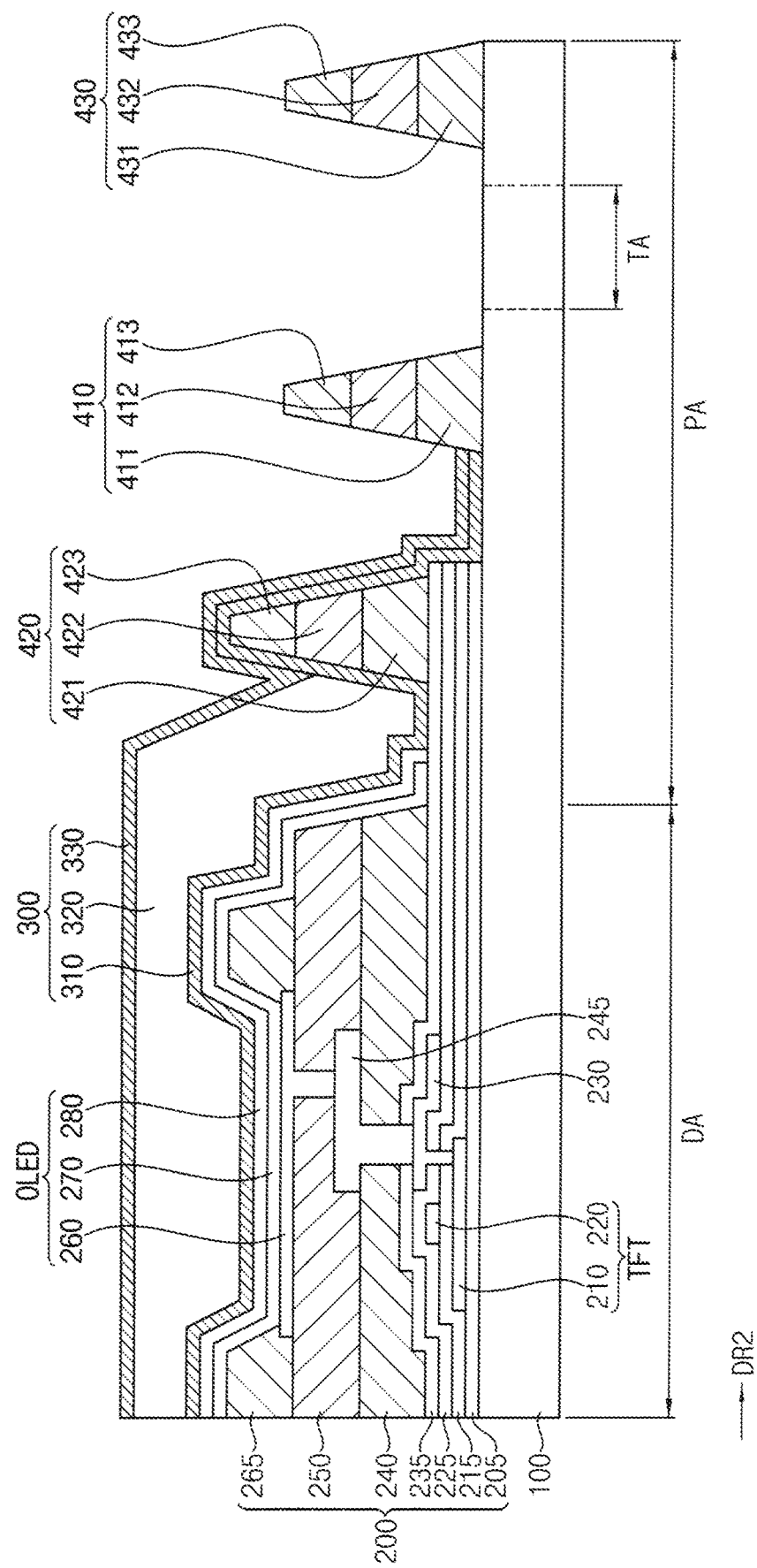
FIG. 3 is a sectional view showing a display device according to one embodiment of the present invention.
Figure 4:
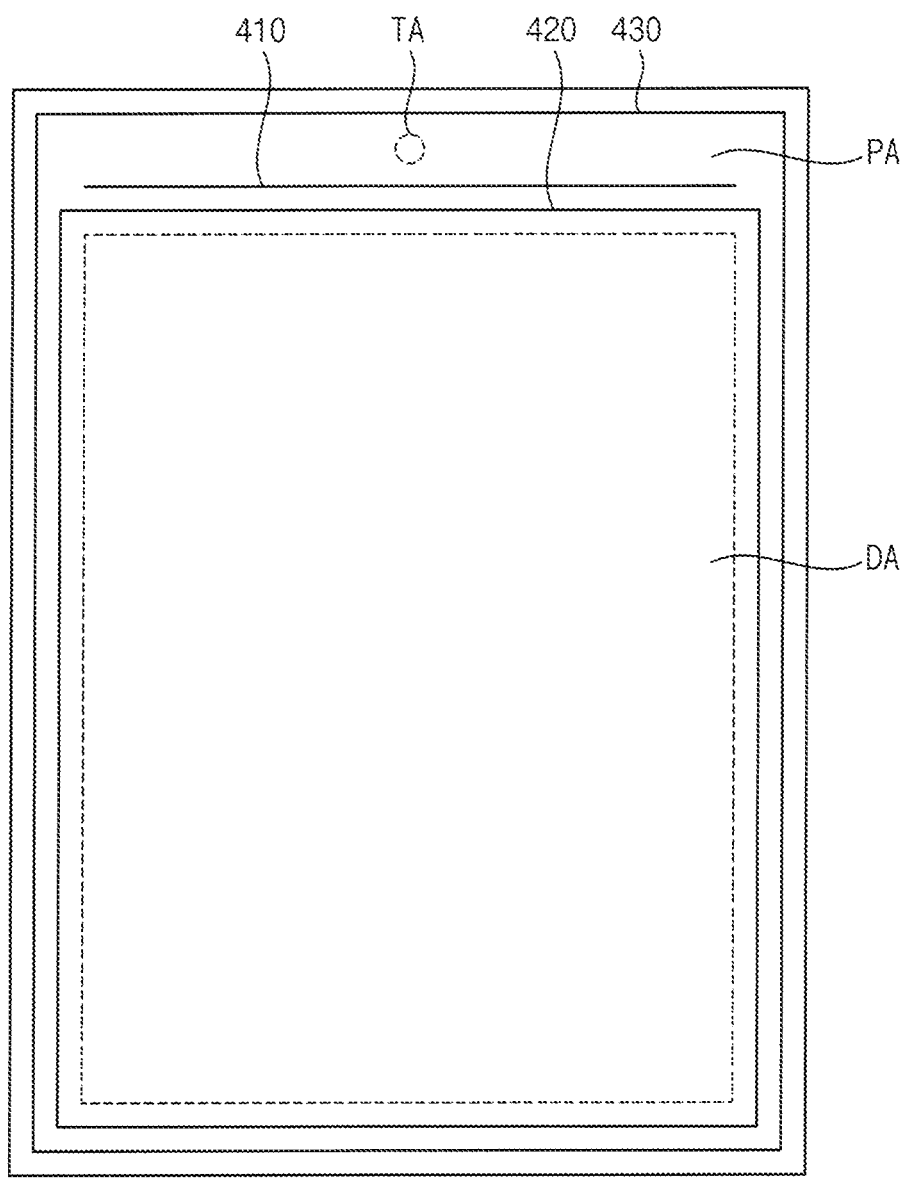
FIG. 4 is a plan view showing dams of a display device according to one embodiment of the present invention.

FIG. 3 is a sectional view showing a display device according to one embodiment of the present invention. FIG. 4 is a plan view showing dams of the display device according to one embodiment of the present invention.

Referring to FIGS. 3 and 4, according to one embodiment of the present invention, a display device may include a substrate 100, a display unit 200, a thin-film encapsulation layer 300, and a plurality of dams 410, 420, and 430.

The substrate 100 may be an insulating substrate including glass, quartz, plastic, or the like. In some embodiments, the substrate 100 may include glass containing silicon oxide ($SiO_x$). In this case, the substrate 100 may have a light transmittance of about 95% or more as compared with a vacuum.

The display unit 200 may be located in the display area DA on the substrate 100. The display unit 200 may include a thin film transistor TFT, a first conductive layer 230, a first insulating layer 240, a second conductive layer 245, a second insulating layer 250, an organic light emitting diode OLED, and a pixel defining layer 265.

A buffer layer 205 may be located on the substrate 100. The buffer layer 205 may block impurities such as oxygen and moisture penetrating through the substrate 100. In addition, the buffer layer 205 may provide a flat surface on an upper portion of the substrate 100. The buffer layer 205 may be an inorganic insulating layer including silicon nitride, silicon oxide, silicon oxynitride, or the like. In some embodiments, the buffer layer 205 may be omitted.

The thin film transistor TFT may be located in the display area DA on the buffer layer 205. The thin film transistor TFT may include an active layer 210 and a gate electrode 220. In some embodiments, the thin film transistor TFT may have a top-gate structure in which the gate electrode 220 is located over the active layer 210. However, embodiments according to the present invention are not limited thereto. In some embodiments, the thin film transistor TFT may have a bottom-gate structure in which a gate electrode is located under the active layer.

The active layer 210 may be located on the buffer layer 205. The active layer 210 may be formed of amorphous silicon, polycrystalline silicon, an oxide semiconductor, or the like. The active layer 210 may include a source region, a drain region, and a channel region formed between the source and drain regions.

A gate insulating layer 215 may be located on the active layer 210. The gate insulating layer 215 may be formed on the buffer layer 205 to cover the active layer 210. The gate insulating layer 215 may insulate the gate electrode 220 from the active layer 210. The gate insulating layer 215 may be an inorganic insulating layer including silicon nitride, silicon oxide, silicon oxynitride, or the like.

The gate electrode 220 may be located on the gate insulating layer 215. The gate electrode 220 may overlap the channel region of the active layer 210. The gate electrode 220 may include a metal such as molybdenum (Mo), aluminum (Al), and copper (Cu), or an alloy of the metal.

An interlayer insulating layer 225 may be located on the gate electrode 220. The interlayer insulating layer 225 may be formed on the gate insulating layer 215 to cover the gate electrode 220. The interlayer insulating layer 225 may insulate the first conductive layer 230 from the gate electrode 220. The interlayer insulating layer 225 may be an inorganic insulating layer including silicon nitride, silicon oxide, silicon oxynitride, or the like.

The first conductive layer 230 may be located in the display area DA on the interlayer insulating layer 225. The first conductive layer 230 may be connected to the source region or the drain region of the active layer 210 through contact holes formed in the interlayer insulating layer 225 and the gate insulating layer 215. The first conductive layer 230 may include a metal such as molybdenum (Mo), aluminum (Al), and copper (Cu), or an alloy of the metal.

A passivation layer 235 may be located on the first conductive layer 230. The passivation layer 235 may be formed on the interlayer insulating layer 225 to cover the first conductive layer 230. The passivation layer 235 may be formed along a profile of the interlayer insulating layer 225 and the first conductive layer 230. The passivation layer 235 may be an inorganic insulating layer including silicon nitride, silicon oxide, silicon oxynitride, or the like.

The inorganic insulating layers 205, 215, 225, and 235 including the buffer layer 205, the gate insulating layer 215, the interlayer insulating layer 225, and the passivation layer 235 may extend from the display area DA to a part of the peripheral area PA. Meanwhile, the inorganic insulating layers 205, 215, 225, and 235 may not cover the transmission area TA in the peripheral area PA. In this case, end portions of the inorganic insulating layers 205, 215, 225, and 235 may be located in the peripheral area PA between the display area DA and the transmission area TA. When the inorganic insulating layers 205, 215, 225, and 235 cover the transmission area TA, the light transmittance of the transmission area TA may be reduced due to the inorganic insulating layers 205, 215, 225, and 235 including mutually different materials. However, according to one embodiment of the present invention, the substrate 100 in the transmission area TA is not covered by the inorganic insulating layers 205, 215, 225, and 235, so that the light transmittance of the transmission area TA may be prevented from being reduced.

The first insulating layer 240 may be located in the display area DA on the passivation layer 235. The first insulating layer 240 may have a flat top surface. The first insulating layer 240 may include an organic insulating material such as an acryl-based resin, an epoxy-based resin, a polyimide-based resin, and a polyester-based resin.

The second conductive layer 245 may be located in the display area DA on the first insulating layer 240. The second conductive layer 245 may be connected to the first conductive layer 230 through contact holes formed in the first insulating layer 240 and the passivation layer 235. The second conductive layer 245 may electrically connect the organic light emitting diode OLED to the thin film transistor TFT together with the first conductive layer 230. The second conductive layer 245 may include a metal such as molybdenum (Mo), aluminum (Al), and copper (Cu), or an alloy of the metal.

The second insulating layer 250 may be located in the display area DA on the second conductive layer 245. The second insulating layer 250 may be formed on the first insulating layer 240 to cover the second conductive layer 245. The second insulating layer 250 may have a flat top surface. The second insulating layer 250 may include an organic insulating material such as an acryl-based resin, an epoxy-based resin, a polyimide-based resin, and a polyester-based resin.

The organic light emitting diode OLED may be located on the second insulating layer 250. The organic light emitting diode OLED may include a first electrode 260, an intermediate layer 270, and a second electrode 280. In some embodiments, the first electrode 260 may be an anode of the organic light emitting diode OLED, and the second electrode 280 may be a cathode of the organic light emitting diode OLED. However, embodiments according to the present invention are not limited thereto. In some embodiments, the first electrode 260 may be the cathode of the organic light emitting diode OLED, and the second electrode 280 may be the anode of the organic light emitting diode OLED.

The first electrode 260 may be located in the display area DA on the second insulating layer 250. The first electrode 260 may be formed for each pixel. The first electrode 260 may be electrically connected to the active layer 210 of the thin film transistor TFT through the first conductive layer 230 and the second conductive layer 245. The first electrode 260 may include a metal, transparent conductive oxide, and the like.

The pixel defining layer 265 may be located in the display area DA on the first electrode 260. The pixel defining layer 265 may be formed on the second insulating layer 250 to cover an edge of the first electrode 260. The pixel defining layer 265 may include an opening that exposes a part of the first electrode 260. For example, the opening of the pixel defining layer 265 may expose a central portion of the first electrode 260, so that the pixel defining layer 265 may define an emission area corresponding to the central portion of the first electrode 260. The pixel defining layer 265 may include an organic insulating material such as an acryl-based resin, an epoxy-based resin, a polyimide-based resin, and a polyester-based resin.

The intermediate layer 270 may be located on the first electrode 260. The intermediate layer 270 may have a multilayer thin-film structure including a light emitting layer located on the first electrode 260 exposed by the opening of the pixel defining layer 265. For example, the intermediate layer 270 may include: a hole injection layer (HIL) configured to inject holes; a hole transport layer (HTL) having excellent hole transport capability and configured to increase an opportunity of recombination between holes and electrons by suppressing movements of electrons that are not combined in the light emitting layer; the light emitting layer configured to emit light by recombination of injected electrons and holes; a hole blocking layer (HBL) configured to suppress movements of holes that are not combined in the light emitting layer; an electron transport layer (ETL) configured to smoothly transport the electrons to the light emitting layer; and an electron injection layer (EIL) configured to inject the electrons.

The second electrode 280 may be located on the intermediate layer 270. The second electrode 280 may be commonly formed in a plurality of pixels. The second electrode 280 may include a metal, transparent conductive oxide, and the like.

The thin-film encapsulation layer 300 that covers the display unit 200 may be located on the substrate 100. The thin-film encapsulation layer 300 may protect the organic light emitting diode OLED from external moisture, oxygen, and the like. To this end, the thin-film encapsulation layer 300 may extend in the display area DA, and extend to a part of the peripheral area PA on an outer side of the display area DA. In some embodiments, the thin-film encapsulation layer 300 may include a first inorganic encapsulation layer 310, an organic encapsulation layer 320, and a second inorganic encapsulation layer 330 that are sequentially stacked. However, embodiments according to the present invention are not limited thereto. In some embodiments, the thin-film encapsulation layer 300 may include a plurality of inorganic encapsulation layers and a plurality of organic encapsulation layers that are alternately arranged.

The first inorganic encapsulation layer 310 may cover the second electrode 280. The first inorganic encapsulation layer 310 may be formed along a profile of a structure formed under the first inorganic encapsulation layer 310. In some embodiments, the first inorganic encapsulation layer 310 may include silicon oxynitride ($SiO_xN_y$). However, embodiments according to the present invention are not limited thereto. In some embodiments, the first inorganic encapsulation layer 310 may include silicon oxide, silicon nitride, aluminum oxide, titanium oxide, nickel oxide, and the like.

The organic encapsulation layer 320 may be located on the first inorganic encapsulation layer 310. The organic encapsulation layer 320 may have a sufficient thickness, and a top surface of the organic encapsulation layer 320 may be substantially flat in the display area DA. The organic encapsulation layer 320 may include polyethylene terephthalate, polyethylene naphthalate, polycarbonate, polyimide, polyethylene sulfonate, polyoxymethylene, polyarylate, hexamethyldisiloxane, and the like.

The second inorganic encapsulation layer 330 may cover the organic encapsulation layer 320. In some embodiments, the second inorganic encapsulation layer 330 may include silicon nitride ($SiN_x$). However, embodiments according to the present invention are not limited thereto. In some embodiments, the second inorganic encapsulation layer 330 may include silicon oxide, silicon oxynitride, aluminum oxide, titanium oxide, nickel oxide, and the like. Each of the first inorganic encapsulation layer 310 and the second inorganic encapsulation layer 330 may have an area larger than an area of the organic encapsulation layer 320, and may make contact with each other on an outer side of the organic encapsulation layer 320. In other words, the organic encapsulation layer 320 may not be exposed to the outside due to the first inorganic encapsulation layer 310 and the second inorganic encapsulation layer 330.

The dams 410, 420, and 430 may be located in the peripheral area PA on the substrate 100. The dams 410, 420, and 430 may include a first dam 410, a second dam 420, and a third dam 430.

The second dam 420 may surround the display area DA, and may be located in the peripheral area PA while being spaced apart from the display unit 200. In some embodiments, the second dam 420 may surround four sides of the display area DA having a rectangular shape when viewed in a plan view. The second dam 420 may be located on at least one inorganic insulating layer extending from the display area DA to the peripheral area PA. In some embodiments, the second dam 420 may be located on the buffer layer 205, the gate insulating layer 215, the interlayer insulating layer 225, and the passivation layer 235 that extend from the display area DA to the peripheral area PA.

When the thin-film encapsulation layer 300, especially the organic encapsulation layer 320 is formed, it may be necessary to restrict a material for forming the organic encapsulation layer 320 so that the material for forming the organic encapsulation layer 320 may be located within a preset area. To this end, the second dam 420 may be located in the peripheral area PA. When the organic encapsulation layer 320 is formed on the first inorganic encapsulation layer 310, the second dam 420 may prevent the material for forming the organic encapsulation layer 320 from moving to an edge of the substrate 100. Accordingly, the organic encapsulation layer 320 may be located on an inner side of the second dam 420. In this case, in the peripheral area PA, the first inorganic encapsulation layer 310 and the second inorganic encapsulation layer 330 may be formed along a profile of the second dam 420 to cover the second dam 420. Meanwhile, the second dam 420 may serve to support masks used when the intermediate layer 270, the second electrode 280, and the like of the organic light emitting diode OLED are formed during a process of manufacturing the display device, and may prevent components formed before the above process from being damaged by making contact with the masks in the above process.

The second dam 420 may have a single-layer structure or a multilayer structure. In some embodiments, the second dam 420 may have a three-layer structure including a first layer 421, a second layer 422, and a third layer 423 that are sequentially stacked. For example, the first layer 421 may be located on substantially the same layer as the first insulating layer 240 and may include substantially the same material as the first insulating layer 240, the second layer 422 may be located on substantially the same layer as the second insulating layer 250 and may include substantially the same material as the second insulating layer 250, and the third layer 423 may be located on substantially the same layer as the pixel defining layer 265 and may include substantially the same material as the pixel defining layer 265.

The third dam 430 may surround the second dam 420, and may be located in the peripheral area PA while being spaced apart from the second dam 420. In some embodiments, the third dam 430 may be directly located on the substrate 100. In other words, a bottom surface of the third dam 430 may make contact with a top surface of the substrate 100. The third dam 430 may serve to prevent impurities such as moisture and oxygen from being introduced from an outside of the peripheral area PA. In addition, the third dam 430 may serve to protect components of the display device from an impact generated from an outer periphery of the peripheral area PA.

The third dam 430 may have a single-layer structure or a multilayer structure. In some embodiments, the third dam 430 may have a three-layer structure including a first layer 431, a second layer 432, and a third layer 433 that are sequentially stacked. For example, the first layer 431 may include substantially the same material as the first insulating layer 240, the second layer 432 may include substantially the same material as the second insulating layer 250, and the third layer 433 may include substantially the same material as the pixel defining layer 265.

The first dam 410 may be located between the second dam 420 and the third dam 430 on the substrate 100. The first dam 410 may be spaced apart from the second dam 420 in the second direction DR2, and located between the second dam 420 and the transmission area TA. Accordingly, the second dam 420 may be located between the display unit 200 and the first dam 410. In addition, the first dam 410 and the third dam 430 may face each other with the transmission area TA interposed therebetween. In some embodiments, the first dam 410 may be directly located on the substrate 100. In other words, a bottom surface of the first dam 410 may make contact with the top surface of the substrate 100. In this case, an end portion of the at least one inorganic insulating layer located in the peripheral area PA may be located on an inner side of the first dam 410.

When the thin-film encapsulation layer 300, especially the first inorganic encapsulation layer 310 and the second inorganic encapsulation layer 330 are formed, it may be necessary to restrict a material for forming the first inorganic encapsulation layer 310 and a material for forming the second inorganic encapsulation layer 330 so that the material for forming the first inorganic encapsulation layer 310 and the material for forming the second inorganic encapsulation layer 330 may not cover the transmission area TA. To this end, the first dam 410 may be located in the peripheral area PA. When the first inorganic encapsulation layer 310 and the second inorganic encapsulation layer 330 are formed, the first dam 410 may prevent the material for forming the first inorganic encapsulation layer 310 and the material for forming the second inorganic encapsulation layer 330 from being formed on the transmission area TA of the substrate 100. Accordingly, the transmission area TA of the substrate 100 may not be covered by the first inorganic encapsulation layer 310 and the second inorganic encapsulation layer 330. In this case, an end portion of the first inorganic encapsulation layer 310 and an end portion of the second inorganic encapsulation layer 330 may make contact with each other on an outer side of the second dam 420, and may be located between the first dam 410 and the second dam 420. Meanwhile, the first dam 410 may serve to support masks used when the first inorganic encapsulation layer 310 and the second inorganic encapsulation layer 330 are formed during the process of manufacturing the display device.

When the first dam 410 is not formed between the second dam 420 and the transmission area TA, the first inorganic encapsulation layer 310 including silicon oxynitride and/or the second inorganic encapsulation layer 330 including silicon nitride may cover the transmission area TA of the substrate 100. In this case, a layer including silicon oxynitride and/or a layer including silicon nitride may be formed on the substrate 100 including silicon oxide, so that the light transmittance of the transmission area TA of the display device may be reduced to 90% or less. However, according to one embodiment of the present invention, the first dam 410 is formed between the second dam 420 and the transmission area TA, so that the first inorganic encapsulation layer 310 and/or the second inorganic encapsulation layer 330 may be prevented from being formed on the transmission area TA of the substrate 100. Accordingly, the light transmittance of the transmission area TA of the display device may be prevented from being reduced.

The first dam 410 may have a single-layer structure or a multilayer structure. In some embodiments, the first dam 410 may have a three-layer structure including a first layer 411, a second layer 412, and a third layer 413 that are sequentially stacked. For example, the first layer 411 may include substantially the same material as the first insulating layer 240, the second layer 412 may include substantially the same material as the second insulating layer 250, and the third layer 413 may include substantially the same material as the pixel defining layer 265.

Figure 5:
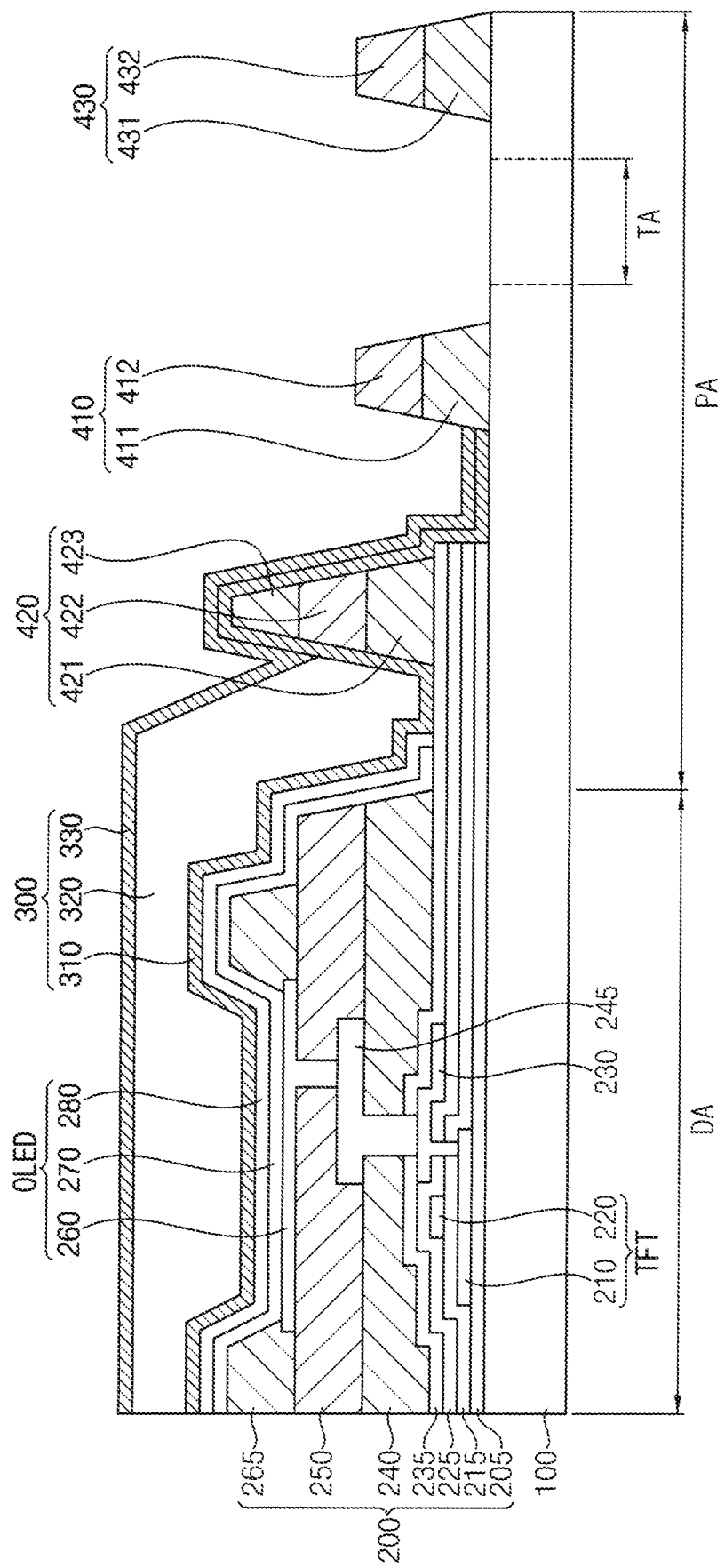
FIGS. 5 and 6 are sectional views display devices according to other embodiments of the present invention.
Figure 6:
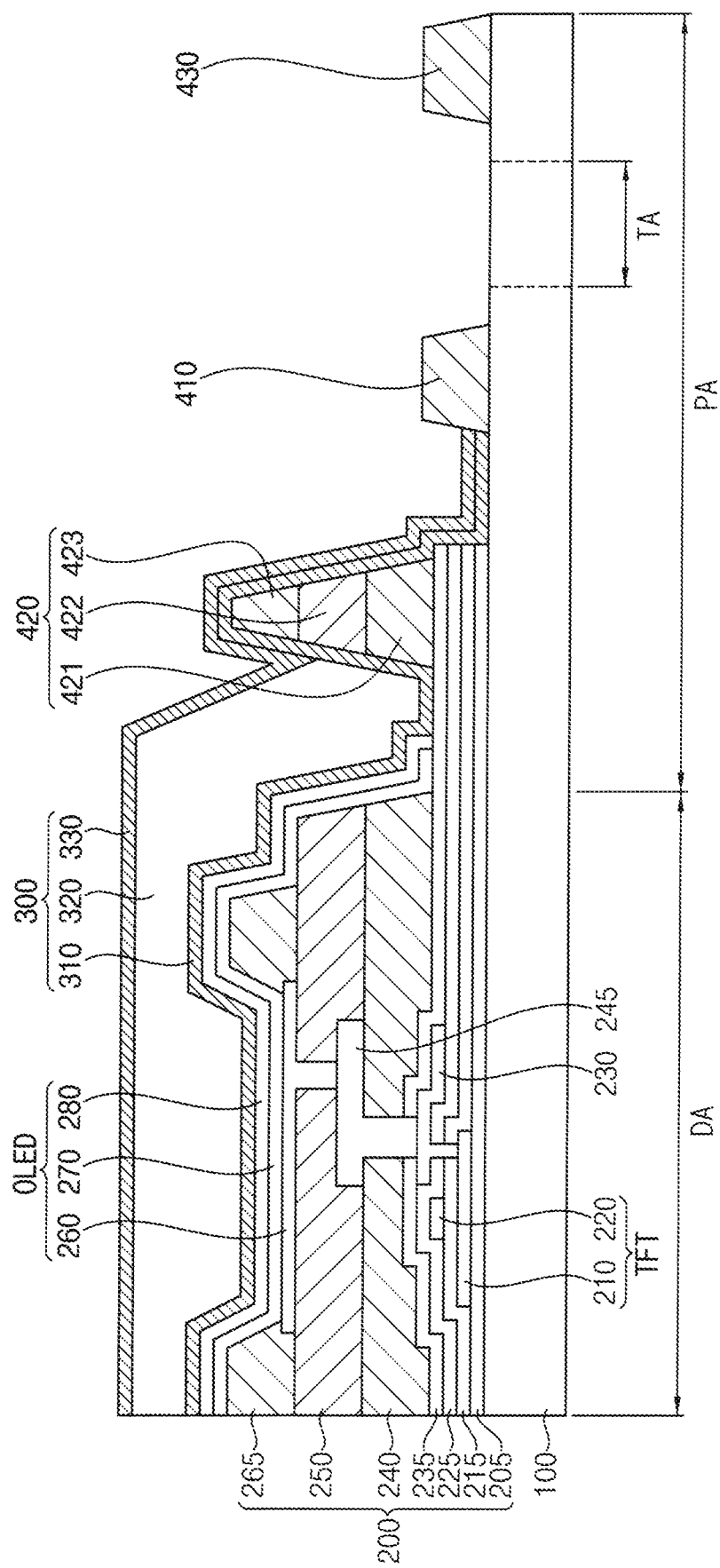

FIGS. 5 and 6 are sectional views display devices according to other embodiments of the present invention.

Referring to FIGS. 5 and 6, in other embodiments, the first dam 410 may have a two-layer structure or a single-layer structure.

In some embodiments, as shown in FIG. 5, the first dam 410 may have a two-layer structure including a first layer 411 and a second layer 412 that are sequentially stacked. For example, the first layer 411 may include substantially the same material as one of the first insulating layer 240 and the second insulating layer 250, and the second layer 412 may include a material that is different from the first layer 411 and substantially the same as a material of one of the second insulating layer 250 and the pixel defining layer 265. In this case, similar to the first dam 410, the third dam 430 may have a two-layer structure including a first layer 431 and a second layer 432.

In some embodiments, as shown in FIG. 6, the first dam 410 may have a single-layer structure. For example, the first dam 410 may include substantially the same material as one of the first insulating layer 240, the second insulating layer 250, and the pixel defining layer 265. In this case, similar to the first dam 410, the third dam 430 may have a single-layer structure.

Referring again to FIGS. 3 and 4, the first dam 410 may extend in the first direction DR1 between the display area DA and the transmission area TA. In this case, the first dam 410 may have a linear shape extending parallel to the first direction DR1 when viewed in a plan view.

In some embodiments, a length of the first dam 410 in the first direction DR1 may be substantially the same as the width of the display area DA in the first direction DR1. Because the width of the transmission area TA in the first direction DR1 is smaller than the width of the display area DA in the first direction DR1, when the length of the first dam 410 in the first direction DR1 is substantially the same as the width of the display area DA in the first direction DR1, the first dam 410 may sufficiently prevent the material for forming the first inorganic encapsulation layer 310 and the material for forming the second inorganic encapsulation layer 330 from being formed on the transmission area TA of the substrate 100.

Figure 7:
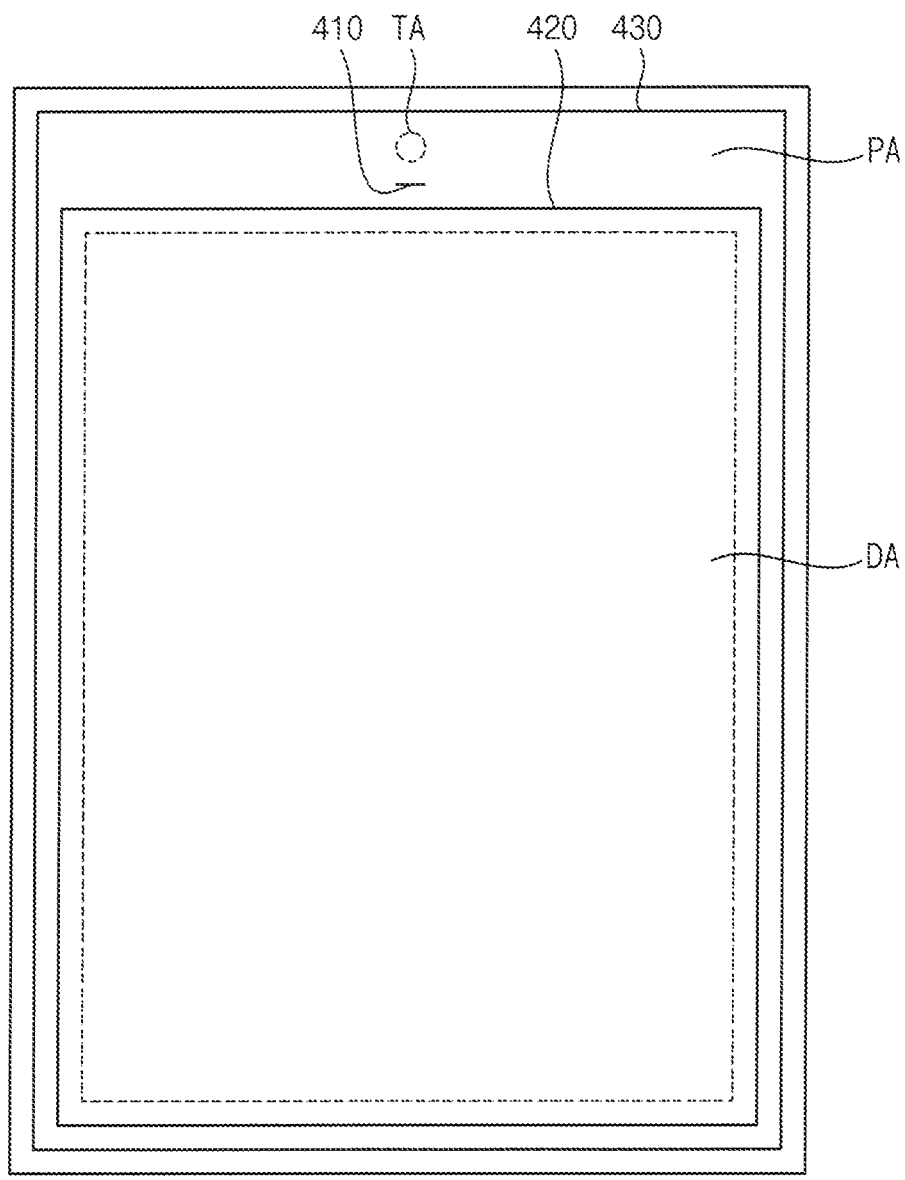
FIGS. 7 and 8 are plan views showing dams of display devices according to other embodiments of the present invention.
Figure 8:
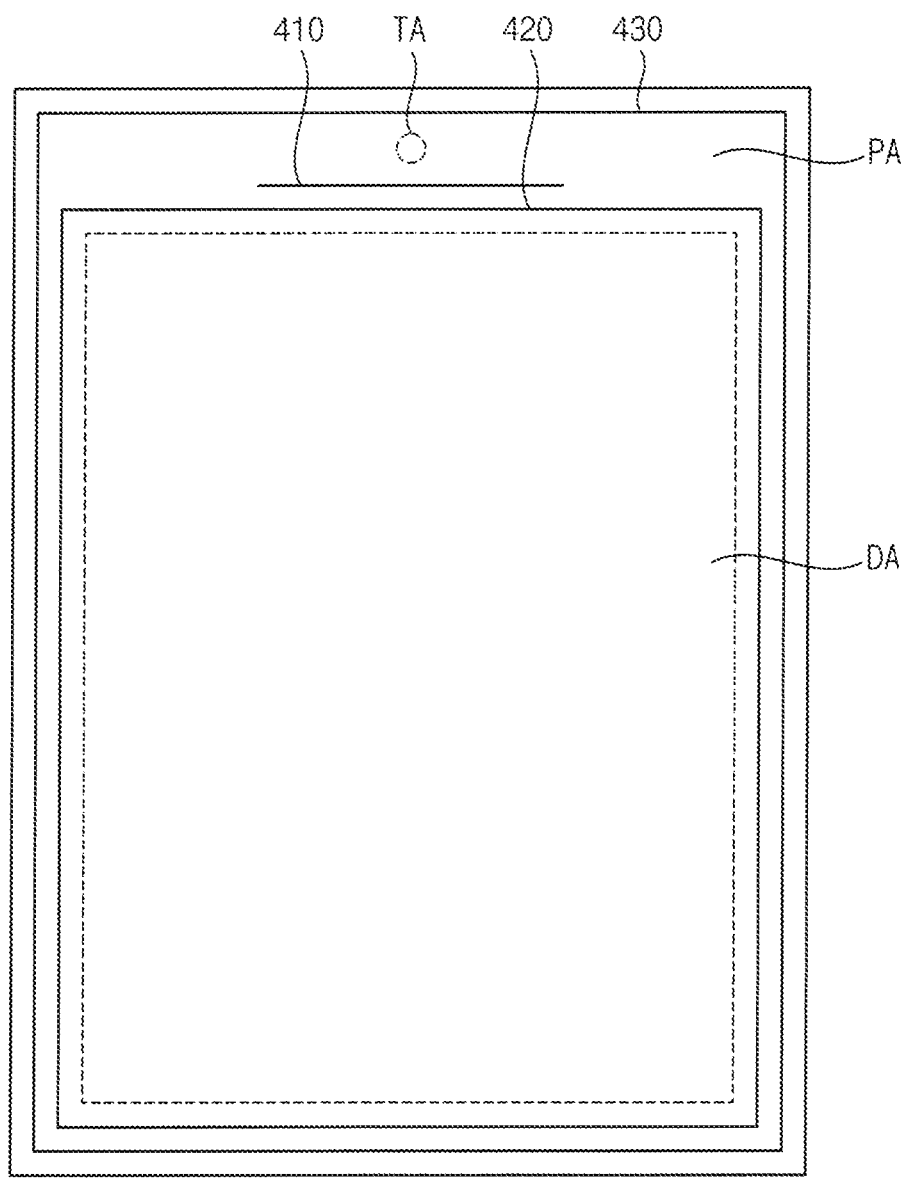

FIGS. 7 and 8 are plan views showing dams of display devices according to other embodiments of the present invention.

Referring to FIGS. 7 and 8, in other embodiments, the length of the first dam 410 in the first direction DR1 may be substantially the same as the width of the transmission area TA in the first direction DR1 (FIG. 7), or may be smaller than the width of the display area DA in the first direction DR1 and greater than the width of the transmission area TA in the first direction DR1 (FIG. 8). In this case, even when the length of the first dam 410 in the first direction DR1 is smaller than the width of the display area DA in the first direction DR1, the length of the first dam 410 in the first direction DR1 is greater than or equal to the width of the transmission area TA in the first direction DR1, so that the first dam 410 may prevent the material for forming the first inorganic encapsulation layer 310 and the material for forming the second inorganic encapsulation layer 330 from being formed on the transmission area TA of the substrate 100.

Hereinafter, a method of manufacturing a display device according to one embodiment of the present invention will be described with reference to FIGS. 9 to 13.

FIGS. 9, 10, 11, 12, and 13 are views showing a method of manufacturing a display device according to one embodiment of the present invention.

Figure 9:
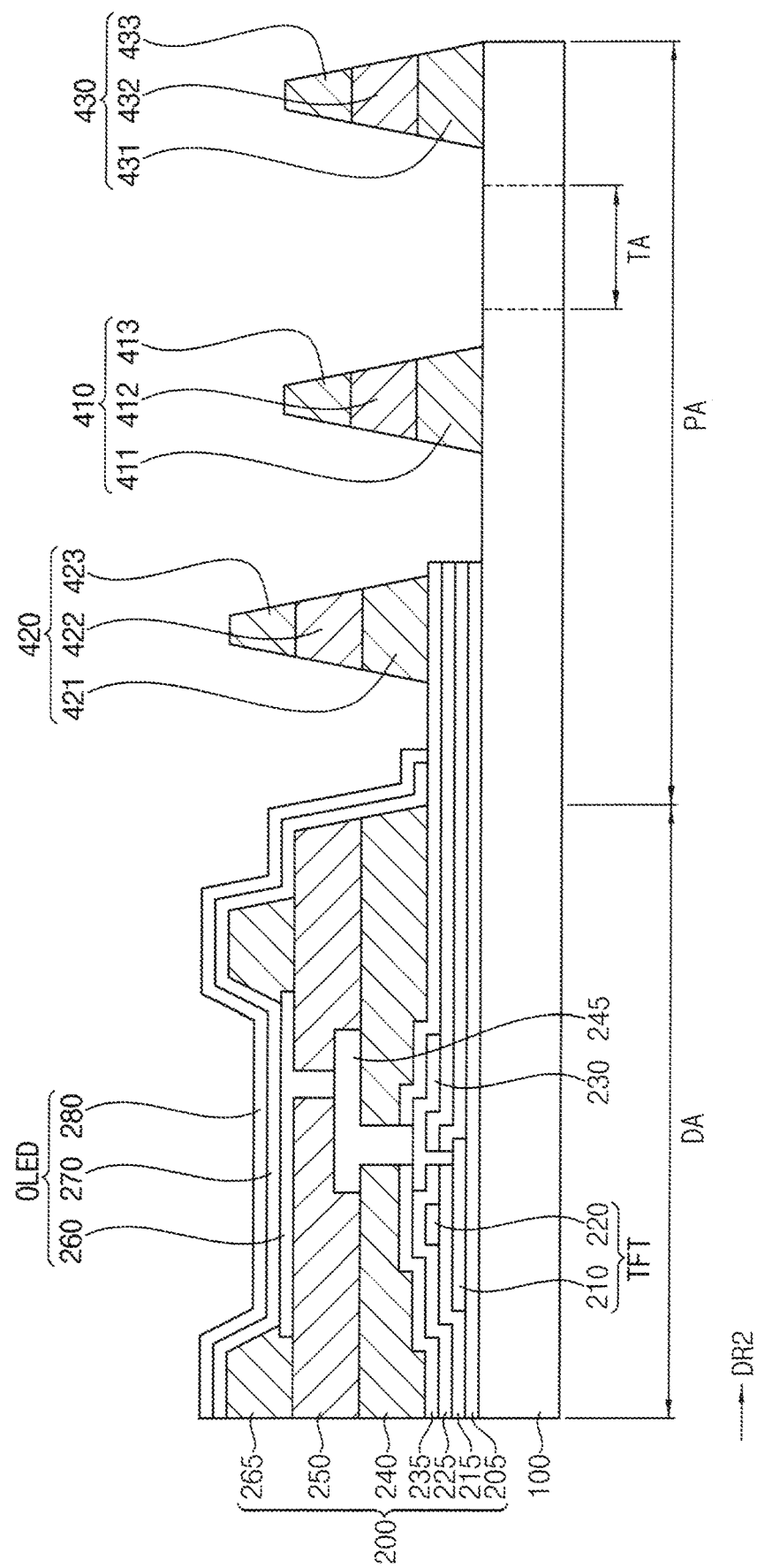
FIGS. 9, 10, 11, 12, and 13 are views showing a method of manufacturing a display device according to one embodiment of the present invention.

Referring to FIG. 9, the display unit 200, the first dam 410, the second dam 420, and the third dam 430 may be formed on the substrate 100.

First, the thin film transistor TFT including the active layer 210 and the gate electrode 220, the first conductive layer 230, and the inorganic insulating layers 205, 215, 225, and 235 including the buffer layer 205, the gate insulating layer 215, the interlayer insulating layer 225, and the passivation layer 235 may be formed on the substrate 100. The buffer layer 205, the active layer 210, the gate insulating layer 215, the gate electrode 220, the interlayer insulating layer 225, the first conductive layer 230, and the passivation layer 235 may be sequentially formed on the substrate 100 by using a deposition process such as chemical vapor deposition (CVD) and sputtering, an etching process using photolithography, or the like. The thin film transistor TFT and the first conductive layer 230 may be formed in the display area DA, and the inorganic insulating layers 205, 215, 225, and 235 may be formed to extend from the display area DA to the peripheral area PA. In this case, the end portions of the inorganic insulating layers 205, 215, 225, and 235 may be located in the peripheral area PA.

Then, the first insulating layer 240, the second conductive layer 245, the second insulating layer 250, the first electrode 260, the pixel defining layer 265, the first dam 410, the second dam 420, and the third dam 430 may be formed on the substrate 100 on which the thin film transistor TFT, the first conductive layer 230, and the inorganic insulating layers 205, 215, 225, and 235 are formed. The first insulating layer 240, the second conductive layer 245, the second insulating layer 250, the first electrode 260, and the pixel defining layer 265 may be sequentially formed in the display area DA on the passivation layer 235.

The first dam 410, the second dam 420, and the third dam 430 may be formed in the peripheral area PA on the substrate 100. The second dam 420 may surround the display area DA while being spaced apart from the display area DA. The second dam 420 may be formed on a portion of the inorganic insulating layers 205, 215, 225, and 235 located in the peripheral area PA among the inorganic insulating layers 205, 215, 225, and 235 extending from the display area DA to the peripheral area PA. The third dam 430 may surround the second dam 420 while being spaced apart from the second dam 420. The first dam 410 may be formed between the second dam 420 and the third dam 430. The first dam 410 and the third dam 430 may face each other with the transmission area TA interposed therebetween. The first dam 410 and the third dam 430 may be directly formed on the substrate 100.

In some embodiments, the first layer 411 of the first dam 410, the first layer 421 of the second dam 420, and the first layer 431 of the third dam 430 may be formed at substantially the same time as the first insulating layer 240 by using substantially the same material as the first insulating layer 240. In this case, the first insulating layer 240, the first layer 411 of the first dam 410, the first layer 421 of the second dam 420, and the first layer 431 of the third dam 430 may be formed at substantially the same time by depositing a material for forming the first insulating layer 240 on the substrate 100 and etching the deposited material.

In some embodiments, the second layer 412 of the first dam 410, the second layer 422 of the second dam 420, and the second layer 432 of the third dam 430 may be formed at substantially the same time as the second insulating layer 250 by using substantially the same material as the second insulating layer 250. In this case, the second insulating layer 250, the second layer 412 of the first dam 410, the second layer 422 of the second dam 420, and the second layer 432 of the third dam 430 may be formed at substantially the same time by depositing a material for forming the second insulating layer 250 on the substrate 100 and etching the deposited material.

In some embodiments, the third layer 413 of the first dam 410, the third layer 423 of the second dam 420, and the third layer 433 of the third dam 430 may be formed at substantially the same time as the pixel defining layer 265 by using substantially the same material as the pixel defining layer 265. In this case, the pixel defining layer 265, the third layer 413 of the first dam 410, the third layer 423 of the second dam 420, and the third layer 433 of the third dam 430 may be formed at substantially the same time by depositing a material for forming the pixel defining layer 265 on the substrate 100 and etching the deposited material.

Then, the intermediate layer 270 and the second electrode 280 may be formed on the substrate 100 on which the first insulating layer 240, the second conductive layer 245, the second insulating layer 250, the first electrode 260, the pixel defining layer 265, the first dam 410, the second dam 420, and the third dam 430 are formed.

Referring to FIGS. 10 to 13, the thin-film encapsulation layer 300 that covers the display unit 200 may be formed on the substrate 100 on which the display unit 200, the first dam 410, the second dam 420, and the third dam 430 are formed, by using a mask 500.

Figure 10:
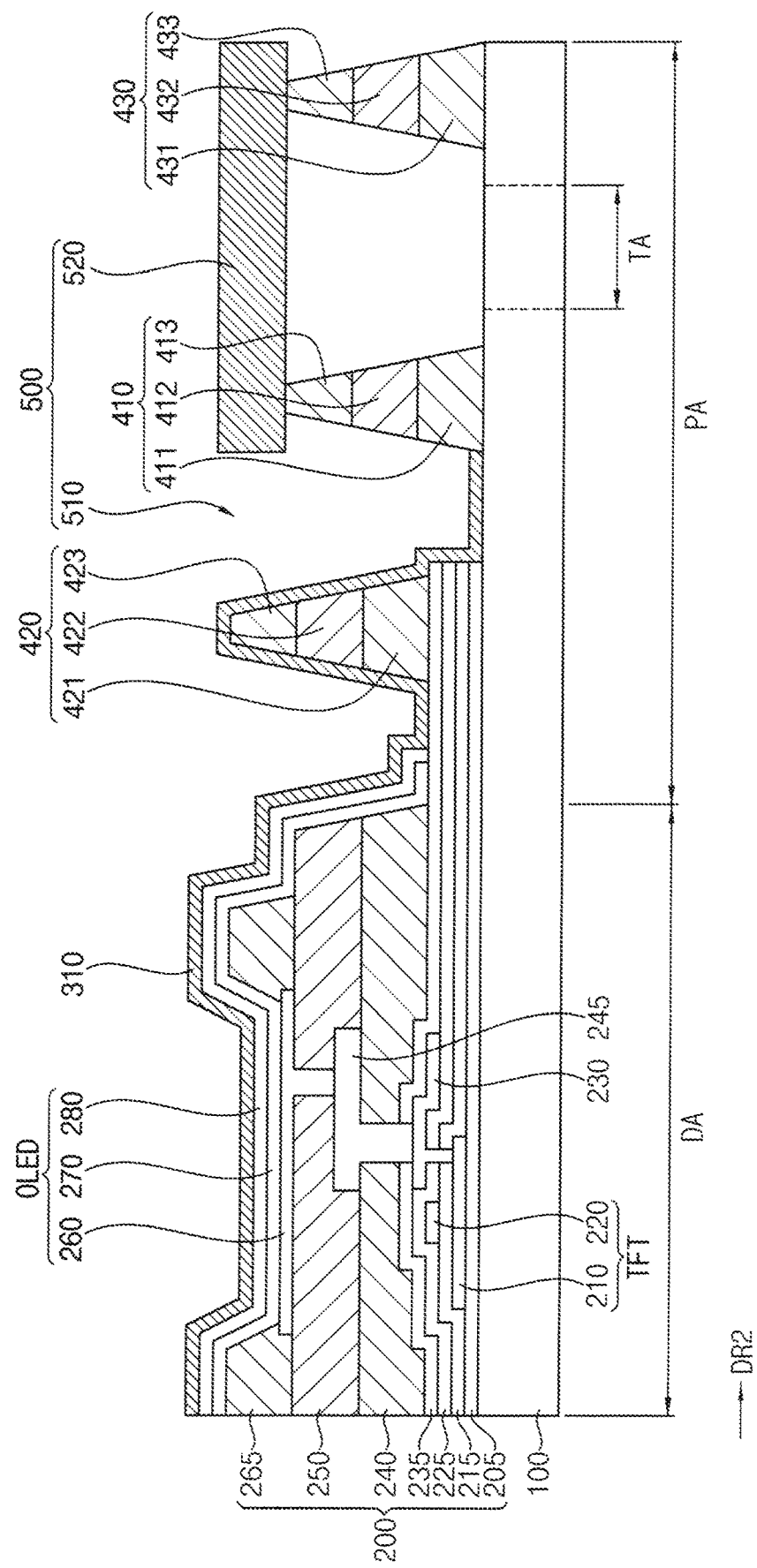
Figure 11:
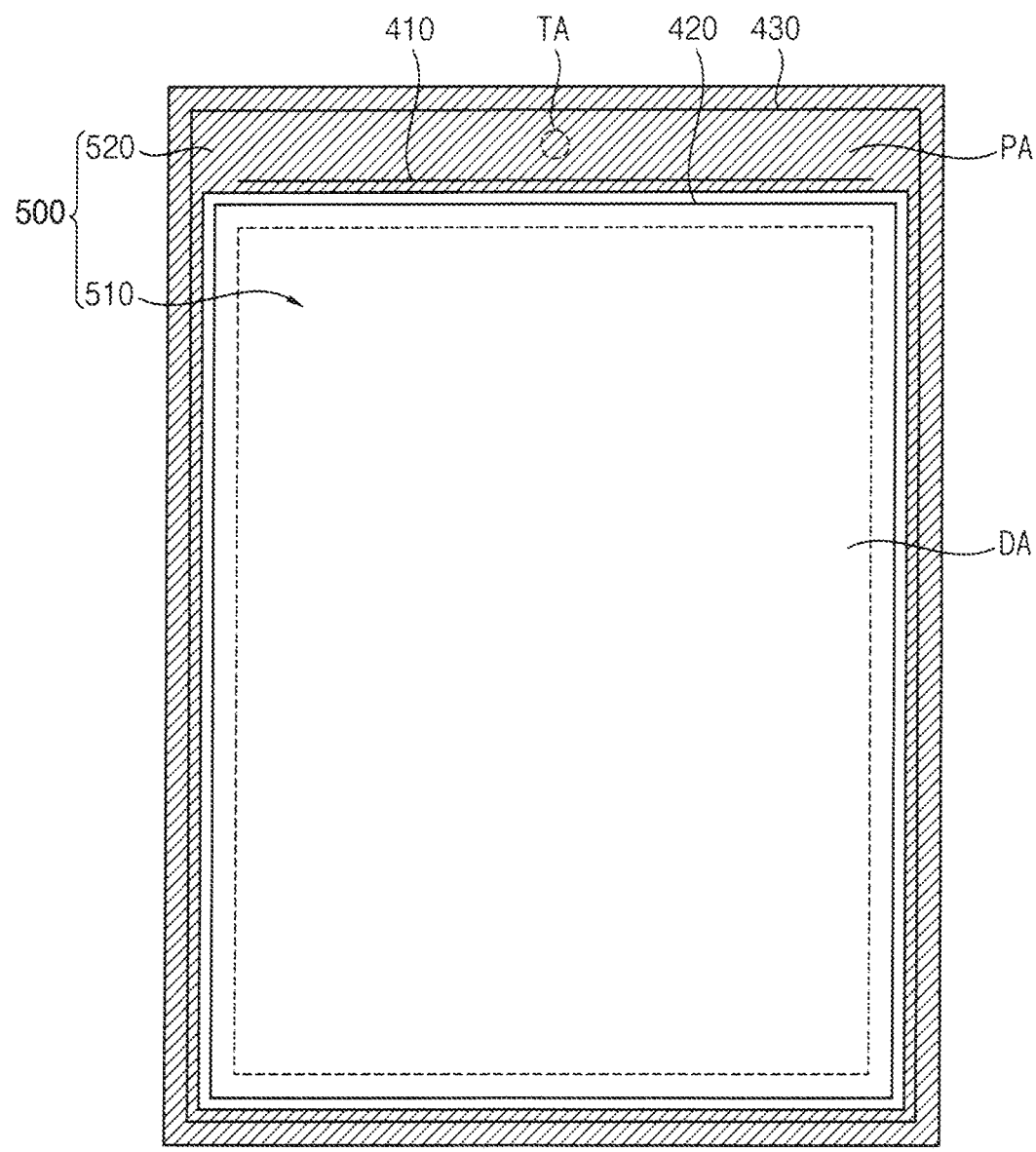

First, as shown in FIGS. 10 and 11, the mask 500 may be located on the substrate 100, and the first inorganic encapsulation layer 310 that covers the second electrode 280 may be formed by using the mask 500.

The mask 500 may include an opening 510 and a frame 520 surrounding the opening 510. The opening 510 may approximately correspond to the display area DA, and the frame 520 may approximately correspond to the peripheral area PA. In detail, the mask 500 may expose the display unit 200 and the second dam 420 through the opening 510, and may cover the first dam 410 and the third dam 430 through the frame 520.

The mask 500 may be arranged to make contact with the first dam 410. In detail, a bottom surface of the frame 520 of the mask 500 may make contact with a top surface of the first dam 410 and a top surface of the third dam 430, so that the mask 500 may be supported by the first dam 410 and the third dam 430.

Because the material for forming the first inorganic encapsulation layer 310 is deposited on the substrate 100 by using the mask 500, the first inorganic encapsulation layer 310 that covers the second electrode 280 may be formed. In some embodiments, the material for forming the first inorganic encapsulation layer 310 may be silicon oxynitride. Because the material for forming the first inorganic encapsulation layer 310 is deposited through the opening 510 of the mask 500, the first inorganic encapsulation layer 310 that covers the display unit 200 and the second dam 420 may be formed. Meanwhile, because the frame 520 of the mask 500 covers the first dam 410 and the third dam 430, and the bottom surface of the frame 520 makes contact with the top surface of the first dam 410 and the top surface of the third dam 430, there is no space between the frame 520 and the first dam 410 and between the frame 520 and the third dam 430, so that the material for forming the first inorganic encapsulation layer 310 may not be deposited in the transmission area TA between the first dam 410 and the third dam 430. Accordingly, the light transmittance of the transmission area TA may be prevented from being reduced.

Figure 12:
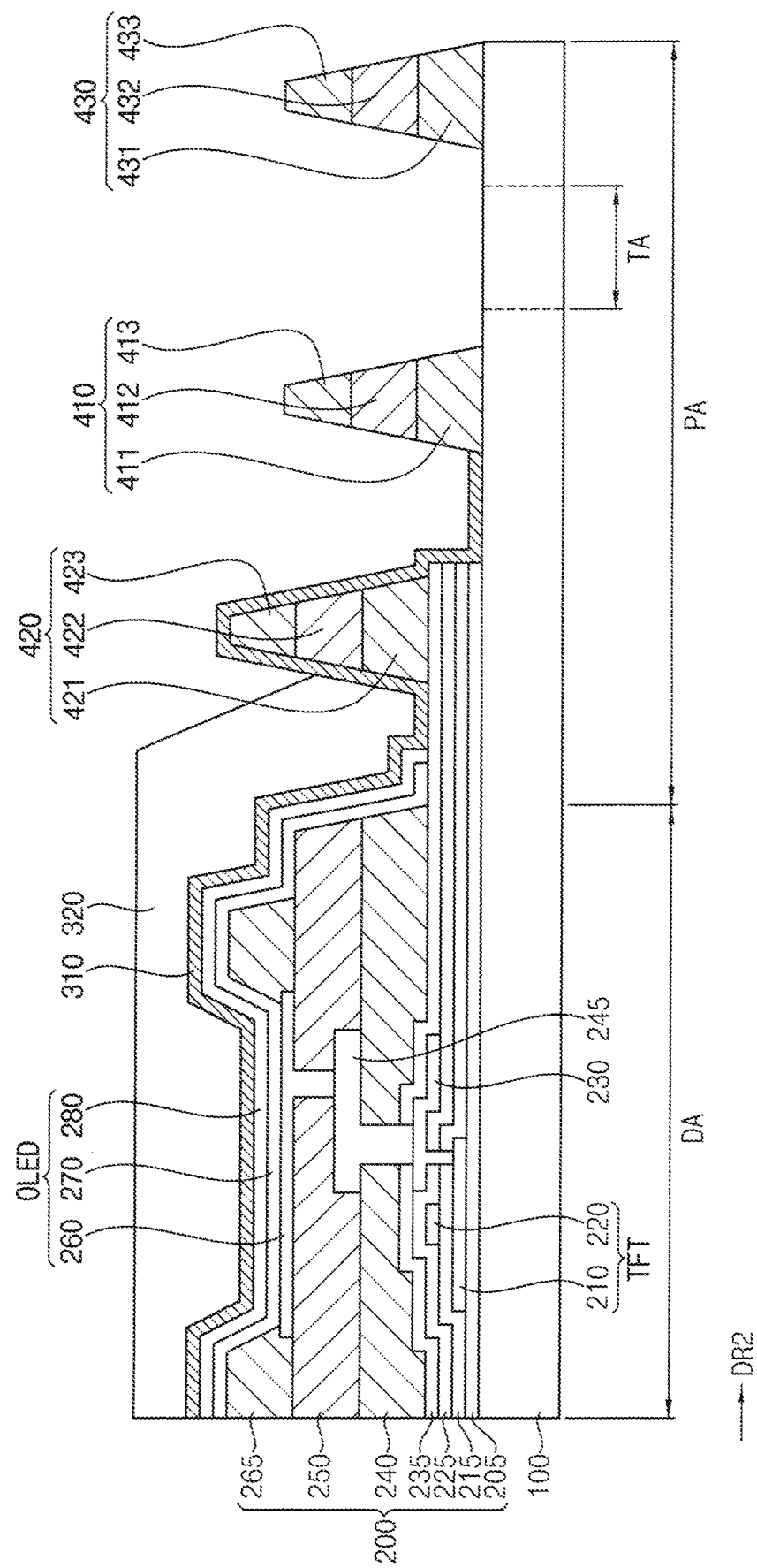

Then, as shown in FIG. 12, the organic encapsulation layer 320 may be formed on the first inorganic encapsulation layer 310. The organic encapsulation layer 320 may be formed on the first inorganic encapsulation layer 310 by applying the material for forming the organic encapsulation layer 320 to the display area DA. The material for forming the organic encapsulation layer 320 may be polyethylene terephthalate, polyethylene naphthalate, polycarbonate, polyimide, polyethylene sulfonate, polyoxymethylene, polyarylate, or hexamethyldisiloxane. The material for forming the organic encapsulation layer 320 may not be applied to an outer side of the second dam 420 due to the second dam 420, so that the organic encapsulation layer 320 may be formed on an inner side of the second dam 420.

Figure 13:
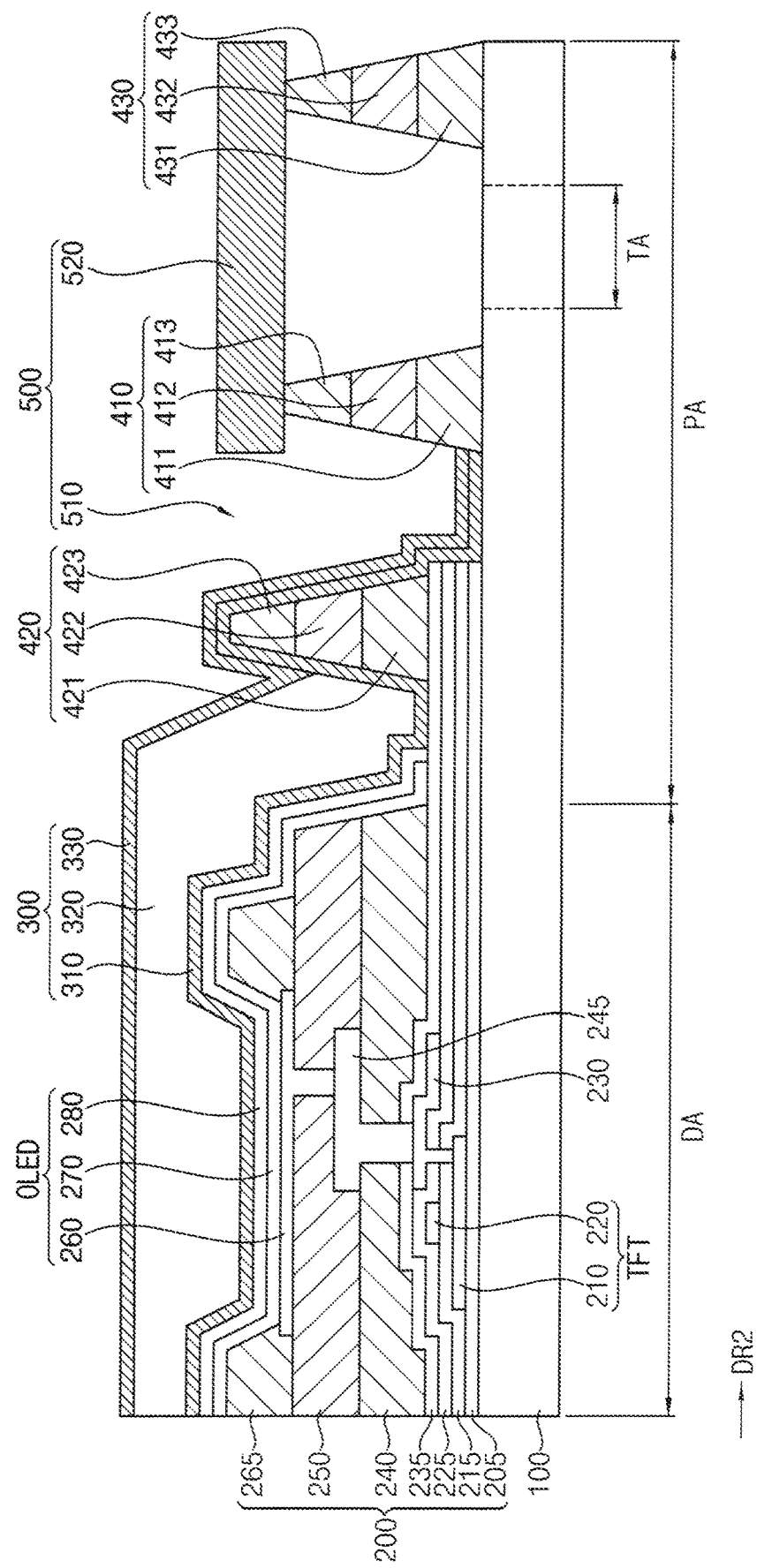

Then, as shown in FIG. 13, the mask 500 may be located on the substrate 100, and the second inorganic encapsulation layer 330 that covers the organic encapsulation layer 320 may be formed by using the mask 500.

Because the material for forming the second inorganic encapsulation layer 330 is deposited on the substrate 100 by using the mask 500, the second inorganic encapsulation layer 330 that covers the organic encapsulation layer 320 may be formed. In some embodiments, the material for forming the second inorganic encapsulation layer 330 may be silicon nitride. Because the material for forming the second inorganic encapsulation layer 330 is deposited through the opening 510 of the mask 500, the second inorganic encapsulation layer 330 that covers the display unit 200 and the second dam 420 may be formed. Meanwhile, because the frame 520 of the mask 500 covers the first dam 410 and the third dam 430, and the bottom surface of the frame 520 makes contact with the top surface of the first dam 410 and the top surface of the third dam 430, there is no space between the frame 520 and the first dam 410 and between the frame 520 and the third dam 430, so that the material for forming the second inorganic encapsulation layer 330 may not be deposited in the transmission area TA between the first dam 410 and the third dam 430. Accordingly, the light transmittance of the transmission area TA may be prevented from being reduced.

INDUSTRIAL APPLICABILITY

The display device according to the embodiments of the present invention may be applied to a display device included in a computer, a notebook, a mobile phone, a smartphone, a smart pad, a PMP, a PDA, an MP3 player, or the like.

Although aspects of the display devices and the methods of manufacturing the display devices according to some embodiments of the present invention have been described with reference to the drawings, the illustrated embodiments are examples, and may be modified and changed by a person having ordinary knowledge in the relevant technical field without departing from the technical spirit of the present invention described in the following claims and their equivalents.

DESCRIPTION OF SOME OF THE REFERENCE NUMERALS

100: substrate
200: display unit
240: first insulating layer
250: second insulating layer
260: first electrode
265: pixel defining layer
280: second electrode
300: thin-film encapsulation layer
310: first inorganic encapsulation layer
320: organic encapsulation layer
330: second inorganic encapsulation layer
410: first dam
420: second dam
430: third dam
500: mask
DA: display area
TA: transmission area

The invention claimed is:

1. A display device comprising:
a substrate including a display area and a transmission area located at an outer side of the display area;
a display unit in the display area on the substrate;
a thin-film encapsulation layer that covers the display unit; and
a first dam between the thin-film encapsulation layer and the transmission area on the substrate,
wherein an end portion of the thin-film encapsulation layer is located at an inner side of the first dam such that the first dam blocks an entirety of the thin-film encapsulation layer from extending to an outer side, opposite the inner side, of the first dam, and
wherein the thin-film encapsulation layer includes a first inorganic encapsulation layer, an organic encapsulation layer, and a second inorganic encapsulation layer that are sequentially stacked.

2. The display device of claim 1, further comprising a second dam surrounding the display area and between the display unit and the first dam on the substrate.

3. The display device of claim 2, wherein the organic encapsulation layer is located on an inner side of the second dam, and
an end portion of the first inorganic encapsulation layer and an end portion of the second inorganic encapsulation layer make contact with each other on an outer side of the second dam.

4. The display device of claim 2, further comprising a third dam surrounding the second dam and located on the substrate to face the first dam with the transmission area interposed therebetween.

5. The display device of claim 1, wherein the first inorganic encapsulation layer includes silicon oxynitride, and
the second inorganic encapsulation layer includes silicon nitride.

6. The display device of claim 1, wherein the first dam is directly on the substrate.

7. The display device of claim 1, wherein the first dam extends in a first direction, and
a width of the transmission area in the first direction is smaller than a width of the display area in the first direction.

8. The display device of claim 7, wherein a length of the first dam in the first direction is equal to the width of the display area.

9. The display device of claim 7, wherein a length of the first dam in the first direction is equal to the width of the transmission area.

10. The display device of claim 7, wherein a length of the first dam in the first direction is less than the width of the display area and greater than the width of the transmission area.

11. The display device of claim 1, wherein the display unit includes:
a thin film transistor on the substrate;
a first insulating layer that covers the thin film transistor;
a second insulating layer on the first insulating layer;
a first electrode on the second insulating layer;
a pixel defining layer on the second insulating layer and including an opening that exposes a part of the first electrode;
a light emitting layer on the first electrode exposed by the opening; and
a second electrode on the light emitting layer.

12. The display device of claim 11, wherein the first dam includes a same material as one of the first insulating layer, the second insulating layer, and the pixel defining layer.

13. The display device of claim 11, wherein the first dam includes a first layer and a second layer,
the first layer includes a same material as one of the first insulating layer, the second insulating layer, and the pixel defining layer, and
the second layer includes a same material as another one of the first insulating layer, the second insulating layer, and the pixel defining layer.

14. The display device of claim 11, wherein the first dam includes a first layer, a second layer, and a third layer,
the first layer includes a same material as one of the first insulating layer, the second insulating layer, and the pixel defining layer,
the second layer includes a same material as another one of the first insulating layer, the second insulating layer, and the pixel defining layer, and
the third layer includes a same material as remaining one of the first insulating layer, the second insulating layer, and the pixel defining layer.

15. The display device of claim 11, further comprising at least one inorganic insulating layer between the substrate and the first insulating layer,
wherein the transmission area is not covered by the at least one inorganic insulating layer.

16. The display device of claim 1, wherein the substrate includes silicon oxide.

17. A method of manufacturing a display device, the method comprising:
preparing a substrate including a display area and a transmission area located at an outer side of the display area;
forming a display unit in the display area on the substrate;
forming a first dam between the display area and the transmission area on the substrate;
arranging a mask, which has an opening corresponding to the display area, on the substrate to make contact with the first dam; and forming a thin-film encapsulation layer, which covers the display unit and has an end portion located on an inner side of the first dam, through the opening of the mask such that the first dam blocks an entirety of the thin-film encapsulation layer from extending to an outer side, opposite the inner side, of the first dam, wherein the thin-film encapsulation layer includes a first inorganic encapsulation layer, an organic encapsulation layer, and a second inorganic encapsulation layer that are sequentially stacked.

18. The method of claim 17, further comprising forming a second dam between the display unit and the first dam on the substrate before arranging the mask.

19. The method of claim 18, wherein the forming of the thin-film encapsulation layer includes:

forming the first inorganic encapsulation layer, which covers the display unit and the second dam and has an end portion located between the first dam and the second dam, by using the mask;

forming the organic encapsulation layer at an inner side of the second dam on the first inorganic encapsulation layer; and forming the second inorganic encapsulation layer, which covers the display unit and the second dam and has an end portion located between the first dam and the second dam, by using the mask.

* * * * *